(12) United States Patent
Janssens

(10) Patent No.: US 11,063,564 B2
(45) Date of Patent: Jul. 13, 2021

(54) BIDIRECTIONAL LEAKAGE COMPENSATION CIRCUITS FOR USE IN INTEGRATED CIRCUITS AND METHOD THEREFOR

(71) Applicant: SEMICONDUCTOR COMPONENTS INDUSTRIES, LLC, Phoenix, AZ (US)

(72) Inventor: Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 135 days.

(21) Appl. No.: 16/527,589

(22) Filed: Jul. 31, 2019

(65) Prior Publication Data

US 2020/0266784 A1 Aug. 20, 2020

Related U.S. Application Data

(60) Provisional application No. 62/806,465, filed on Feb. 15, 2019.

(51) Int. Cl.
*H03F 3/45* (2006.01)

(52) U.S. Cl.
CPC ..... *H03F 3/45475* (2013.01); *H03F 3/45497* (2013.01); *H03F 3/45937* (2013.01); *H03F 3/45986* (2013.01)

(58) Field of Classification Search
CPC .................................. H03F 3/45; H03M 1/06
USPC .................................. 327/362, 378; 330/252
See application file for complete search history.

(56) References Cited

U.S. PATENT DOCUMENTS

| | | | |
|---|---|---|---|
| 4,404,479 A * | 9/1983 | Toyomaki ............ | G11C 27/026 327/95 |
| 10,026,728 B1 | 7/2018 | Agam et al. | |
| 2010/0007419 A1 | 1/2010 | Gilbert | |
| 2016/0261110 A1 | 9/2016 | Ivanov et al. | |
| 2018/0275280 A1 | 9/2018 | Eken et al. | |
| 2019/0051368 A1 * | 2/2019 | Elsayed ............... | G11C 27/024 |
| 2020/0295771 A1 * | 9/2020 | O'Sullivan ............. | H03M 1/06 |

* cited by examiner

*Primary Examiner* — Steven J Mottola
(74) *Attorney, Agent, or Firm* — Polansky & Associates, P.L.L.C.; Paul J. Polansky

(57) ABSTRACT

A leakage compensation circuit includes a buffer amplifier, a link coupling element, and a leakage compensation element. The buffer amplifier has an input coupled to a sense node, and an output. The link coupling element has an input coupled to the output of the buffer amplifier, and an output, wherein the link coupling element is unidirectional in a direction from the input to the output thereof. The leakage compensation element has a first current terminal coupled to the sense node, a control terminal coupled to the output of the link coupling element, and a second current terminal coupled to a reference voltage terminal.

26 Claims, 10 Drawing Sheets

BIDIRECTIONAL LEAKAGE COMPENSATION CIRCUITS FOR USE IN INTEGRATED CIRCUITS AND METHOD THEREFOR

FIELD OF THE DISCLOSURE

The present disclosure relates generally to integrated circuits, and more particularly to leakage compensation circuits for use in integrated circuits.

BACKGROUND

Certain environmental sensors such as rain and light sensors, ambient light sensors, laser distance and ranging (LiDAR) sensors, and the like require a very high dynamic range at their input. For example, they may produce a sensed current on the order of 50 picoamperes (pA) or less. While integrated circuit and radio frequency (RF) noise can be reduced by choosing the proper circuit topology or by increasing the sensor's current consumption, direct current (DC) offsets caused by leakage currents produced on the integrated circuit remain very difficult to compensate. For example, integrated circuit input terminals are generally protected by diodes that inject leakage currents onto various circuit nodes. These DC offset currents significantly limit the achievable gain, and hence the input range, and may actually prevent some small signals from being detectable at all.

While DC offset voltages can be removed by a chopping mechanism with differential circuit structures, DC leakage currents are in general single-ended. Also, while DC offset voltages can be removed by storing the offset voltage using a switched capacitor mechanism, currents cannot be stored. Moreover, leakage currents are generally very small, and virtually impossible to compensate by any known current digital-to-analog converters (DACs), since the currents are too low to process using current mirrors. Bidirectional current DACs based on a reference leakage current and single-ended current DACs with selectable current mirrors have proven to be inadequate to compensate for these small leakage currents. Thus, leakage currents that are inherent features of integrated circuit design limit the dynamic range of the sensors.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
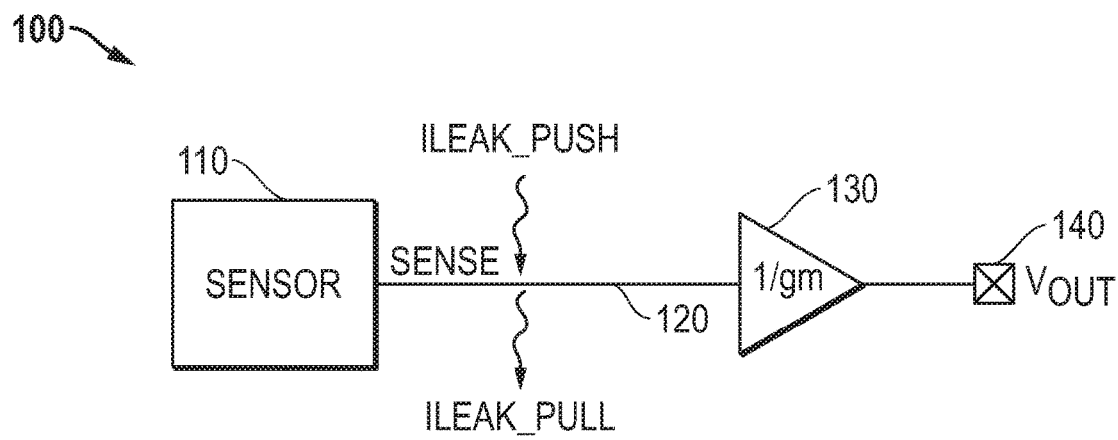
FIG. 1 illustrates in block diagram form a sensor circuit susceptible to leakage.

FIG. 1 illustrates in block diagram form a sensor circuit 100 susceptible to leakage. Sensor circuit 100 includes a sensor 110, a sense node 120 labeled "SENSE", a transimpedance amplifier 130, and an integrated circuit terminal 140. Sensor 110 has an output for providing a current to sense node 120 in response to sensing one of a variety of environmental conditions such as a rain, light, ambient light, etc. Transimpedance amplifier 120 has an input connected to sense node 120, and an output connected to integrated circuit terminal 140 for providing a voltage labeled "$V_{OUT}$" thereto, and an associated transimpedance labeled "1/gm".

Certain non-idealities can distort the operation of sensor 110 and reduce its dynamic range. For example, direct current (DC) offsets caused by relatively small leakage currents of unknown sign remain very difficult to compensate. FIG. 1 shows two possible leakage currents that may impact the operation of sensor 110. One possible leakage current labeled "ILEAK_PUSH" represents positive current injected (or "pushed") onto sense node 120. Another possible leakage current labeled "ILEAK_PULL" represents positive current drawn (or "pulled") from sense node 120. In many integrated circuits, these small currents cannot be easily estimated or measured ahead of time, and even the direction of the leakage current cannot be easily predicted, making them very difficult to compensate.

DC offset voltages can be removed by a chopping mechanism. However, the chopping mechanism cannot be used to compensate for DC leakage current because it often involves differential structures, while DC leakage currents are single ended. Also, while a DC offset voltage can be removed by storing the offset voltage using a switched capacitor circuit, leakage currents cannot be stored. In addition, because the leakage currents are generally very small, they are virtually impossible to compensate by any other known circuit, such as a current digital-to-analog converter (DAC).

Figure 2:
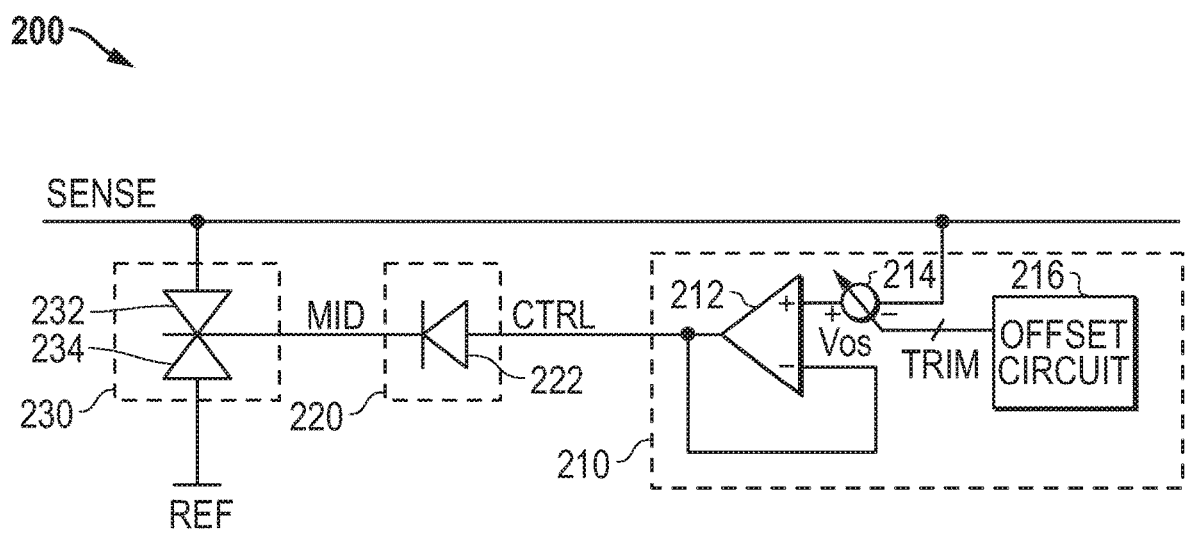
FIG. 2 illustrates in partial block diagram and partial schematic form a leakage compensation circuit according to various embodiments.

FIG. 2 illustrates in partial block diagram and partial schematic form a leakage compensation circuit 200 according to various embodiments. Leakage compensation circuit 200 includes generally a buffer amplifier 210, a link coupling element 220, and a leakage compensation element 230. Buffer amplifier 210 has an input connected to the SENSE node, and an output connected to a node labeled "CTRL". Link coupling element 220 has an input connected to the output of buffer amplifier 210, and an output connected to a node labeled "MID". Leakage compensation element 230 has a first current terminal connected to the SENSE node, a control terminal connected to the MID node, and a second current terminal connected to a reference voltage terminal labeled "REF".

In the embodiment shown in FIG. 2, buffer amplifier 210 includes a differential amplifier 212, a variable-offset generator 214, and an offset circuit 216. Differential amplifier 212 has a positive input labeled "+", a negative input labeled "−", and an output connected to the negative input thereof for providing an output voltage to the CTRL node. Variable-offset generator 214 has a negative terminal connected to the SENSE node, a digital control input, and a positive terminal connected to the positive input of differential amplifier 212. Offset circuit 216 has an output connected to the digital control input of variable offset generator 214 for providing a multi-bit digital signal labeled "TRIM". Link coupling element 220 includes a PN junction diode 222 having an anode forming the input of link coupling element 220, and a cathode forming the output of link coupling element 220. Leakage compensation element 230 includes an anti-series diode having a PN junction diode 232 and a PN junction diode 234. PN junction diode 232 is a "top" diode having an anode connected to the SENSE node, and a cathode connected to the MID node. PN junction diode 232 is a "bottom" diode having a cathode connected to the MID node, and an anode connected to the REF terminal.

In operation, leakage compensation circuit 200 compensates for leakage currents on the SENSE node by subtracting (pulling) or adding (pushing) a controlled, compensating leakage current designated "$I_{COMP}$" from or to the SENSE node. As will be explained further below, since the nature of $I_{COMP}$ is a junction leakage current as well, the general behavior of $I_{COMP}$ over temperature can be expected to be similar to the existing leakage current. Moreover leakage compensation circuit 200 controls the exact amount of compensation current as well as its sign by the voltage applied to leakage compensating element 230.

In leakage compensation circuit 200, buffer amplifier 210 is connected in a voltage follower configuration in which the output provided to the CTRL node is equal to the voltage on the SENSE node plus offset voltage $V_{OS}$. Offset voltage $V_{OS}$ in turn is set by digital trim signal TRIM provided by offset circuit 216. Link coupling element 220 is a diode that conducts current in a direction from the input to the output when the voltage across the PN junction is forward biased. Because the magnitude of the forward current at around the cut-in voltage is substantially greater than the magnitude of the reverse saturation current, for example greater than three orders of magnitude, link coupling element 220 is considered to be a unidirectional element. Thus PN junction diode 222 is a link coupling element that is capable of conducting more current in one direction (the forward direction) than in the other direction (reverse direction) and sets the voltage on the MID node. By a feedback control loop formed by buffer amplifier 210, link coupling element 220, and leakage compensation element 230, leakage compensation circuit 200 provides a compensation current $I_{COMP}$ to be pulled from or pushed into the SENSE node that accurately matches the leakage current.

Further details of various implementations of the components of leakage compensation circuit 200 will now be presented.

Implementations of Buffer Amplifier 210

Figure 3:
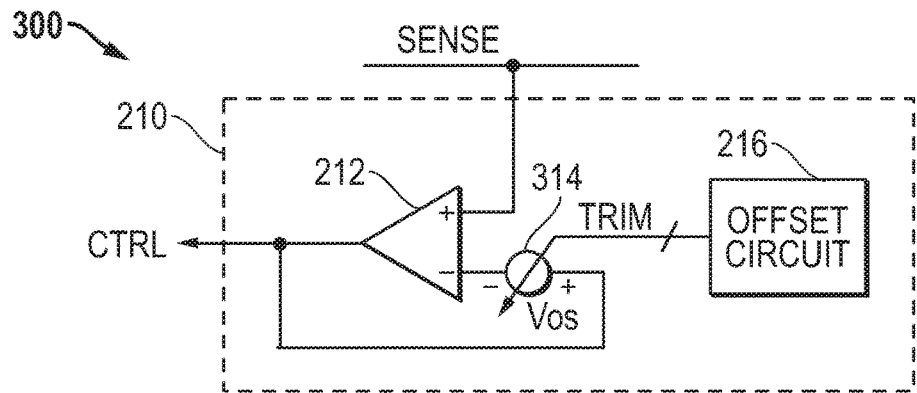
FIG. 3 illustrates in partial block diagram and partial schematic a buffer amplifier according to another embodiment of the buffer amplifier of FIG. 2.

FIG. 3 illustrates in partial block diagram and partial schematic a buffer amplifier 300 according to another embodiment of buffer amplifier 210 of FIG. 2. Buffer amplifier 300 includes differential amplifier 212 and offset circuit 216 as previously described with respect to FIG. 2. Unlike buffer amplifier 210, however, buffer amplifier 300 includes a variable-offset generator 314 configured differently than variable-offset generator 214 of FIG. 2. Variable-offset generator 314 has a positive terminal connected to the output of differential amplifier 212, a digital control input connected to the output of offset circuit 216 for receiving the TRIM signal therefrom, and a negative terminal connected to the negative input of differential amplifier 212. Thus, a variable-offset generator, either 214 of FIG. 2 or 314 of FIG. 3, can achieve the same result by being connected to either the positive input of differential amplifier 212 or the negative input of differential amplifier 212.

Figure 4:
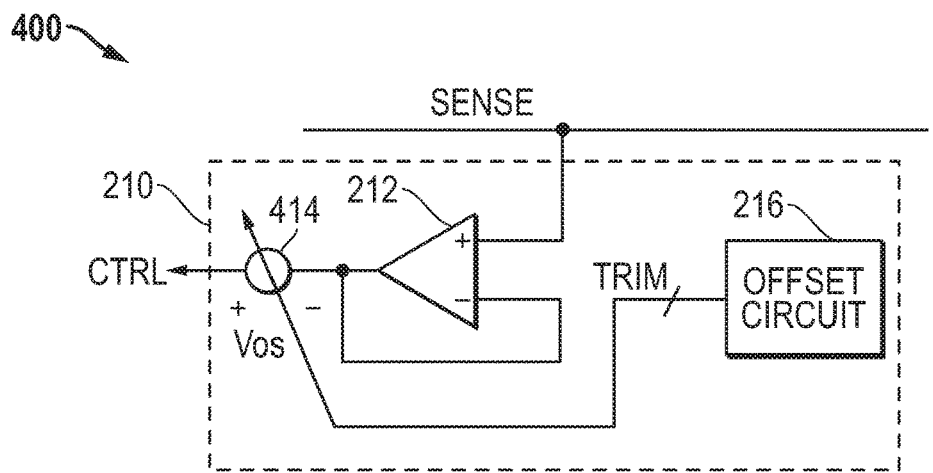
FIG. 4 illustrates in partial block diagram and partial schematic a buffer amplifier according to yet another embodiment of the buffer amplifier of FIG. 2.

FIG. 4 illustrates in partial block diagram and partial schematic a buffer amplifier 400 according to yet another embodiment of buffer amplifier 210 of FIG. 2. Buffer amplifier 400 includes differential amplifier 212 and offset circuit 216 as previously described with respect to FIG. 2. Unlike buffer amplifier 210, however, buffer amplifier 400 includes a variable-offset generator 414 configured differently than variable-offset generator 214 of FIG. 2. Variable-offset generator 414 has a negative terminal connected to the output of differential amplifier 212, a control input connected to the output of offset circuit 216 for receiving the TRIM signal therefrom, and a positive terminal connected to the CTRL node. Buffer amplifier 400 illustrates that the same result can be achieved by connecting variable-offset generator 414 to the output of differential amplifier 212.

Figure 5:
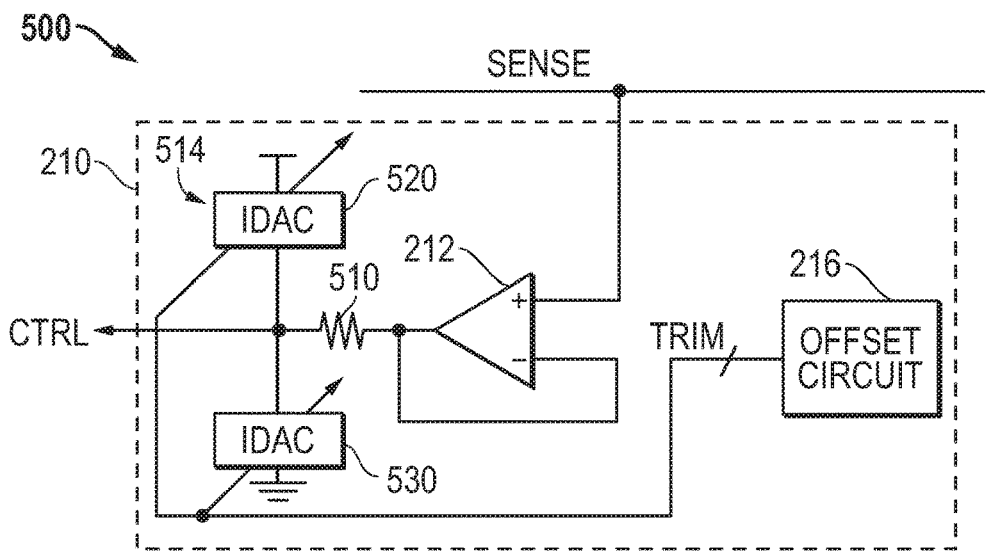
FIG. 5 illustrates in partial block diagram and partial schematic a buffer amplifier according to still another embodiment of the buffer amplifier of FIG. 2.

FIG. 5 illustrates in partial block diagram and partial schematic a buffer amplifier 500 according to still another embodiment of buffer amplifier 210 of FIG. 2. Buffer amplifier 500 includes differential amplifier 212 and offset circuit 216 as previously described with respect to FIG. 2. Unlike buffer amplifier 210, however, buffer amplifier 500 includes a variable-offset generator 514 configured differently than variable-offset generator 214 of FIG. 2. Variable-offset generator 514 includes a resistor 510, and a current DAC 520 and a current DAC 530 each labeled "IDAC". Resistor 510 has a first terminal connected to the output of differential amplifier 212, and a second terminal connected to the CTRL node. Current DAC 520 has a first current terminal connected to a power supply voltage terminal, a control input connected to the output of offset circuit 216 for receiving the TRIM signal, and a second current terminal connected to the CTRL node for sourcing current to the CTRL node. Current DAC 530 has a first terminal connected to the CTRL node for sinking current from the CTRL node, a control input connected to the output of offset circuit 216 for receiving the TRIM signal, and a second current terminal connected to ground. Since the control terminal of leakage compensation element 230 is a high impedance node, the currents provided by current DACs 520 and 530 flowing through resistor 510 create a desired voltage offset whose magnitude is determined by the TRIM signal.

From the various examples shown in FIGS. 2-5, it should be apparent that the offset voltage may be generated in various ways and may use various circuits. Offset circuit 216 can also determine the value of the TRIM signal in various ways. For example, the value of the TRIM signal can be calibrated at manufacturing test for each chip and offset circuit 216 can include a non-volatile memory to store the calibrated values for use during operation. In another example, offset circuit 216 can determine the TRIM bits in part by using manufacturing process measurements, either from on-chip process control devices, or measurements of process control parameters in the wafer on which the chip is contained.

Implementations of Link Coupling Element 220

Figure 6:
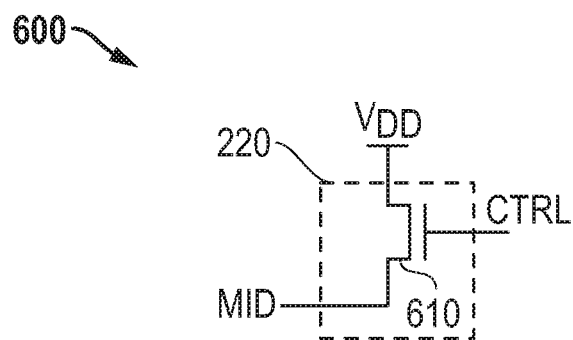
FIG. 6 illustrates in schematic form a link coupling element according to another embodiment of the link coupling element of FIG. 2.

FIG. 6 illustrates in schematic form a link coupling element 600 according to another embodiment of link coupling element 220 of FIG. 2. Link coupling element 600 includes a transistor 610 that in the illustrated embodiment is an N-channel MOS transistor having a drain connected to a positive power supply terminal labeled "$V_{DD}$", a gate connected to the CTRL node, and a source connected to the MID node. $V_{DD}$ is a more-positive power supply voltage terminal with respect to ground for the integrated circuit and whose voltage is higher than the highest desired voltage of the MID node, so that transistor 610 operates as a source follower and the voltage of the MID node follows the voltage of the CTRL node minus a threshold voltage drop. Like PN junction diode 222 of FIG. 2, transistor 610 is biased to be unidirectional and allows current to flow into the MID node but does not allow any substantial DC current to flow out of the MID node.

Figure 7:
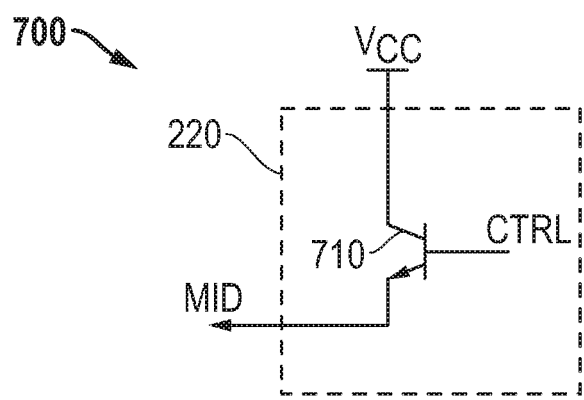
FIG. 7 illustrates in schematic form another embodiment of a link coupling element according to another embodiment of the link coupling element of FIG. 2.

FIG. 7 illustrates in schematic form a link coupling element 700 according to another embodiment of link coupling element 220 of FIG. 2. Link coupling element 700 includes a transistor 710 that in the illustrated embodiment is an NPN bipolar transistor having a collector connected to a positive power supply terminal labeled "$V_{CC}$", a base connected to the CTRL node, and an emitter connected to the MID node. $V_{CC}$ is a more-positive power supply voltage terminal with respect to ground for the integrated circuit and whose voltage is higher than the highest desired voltage of the MID node so that transistor 710 operates as an emitter follower and that the voltage of the MID node follows the voltage of the CTRL node minus the diode cut-in voltage of the base-emitter diode. Like PN junction diode 222 of FIG. 2, transistor 710 is biased to be unidirectional and allows current to flow into the MID node but does not allow any substantial DC current to flow out of the MID node.

Operation of the Control Loop

Figure 8:
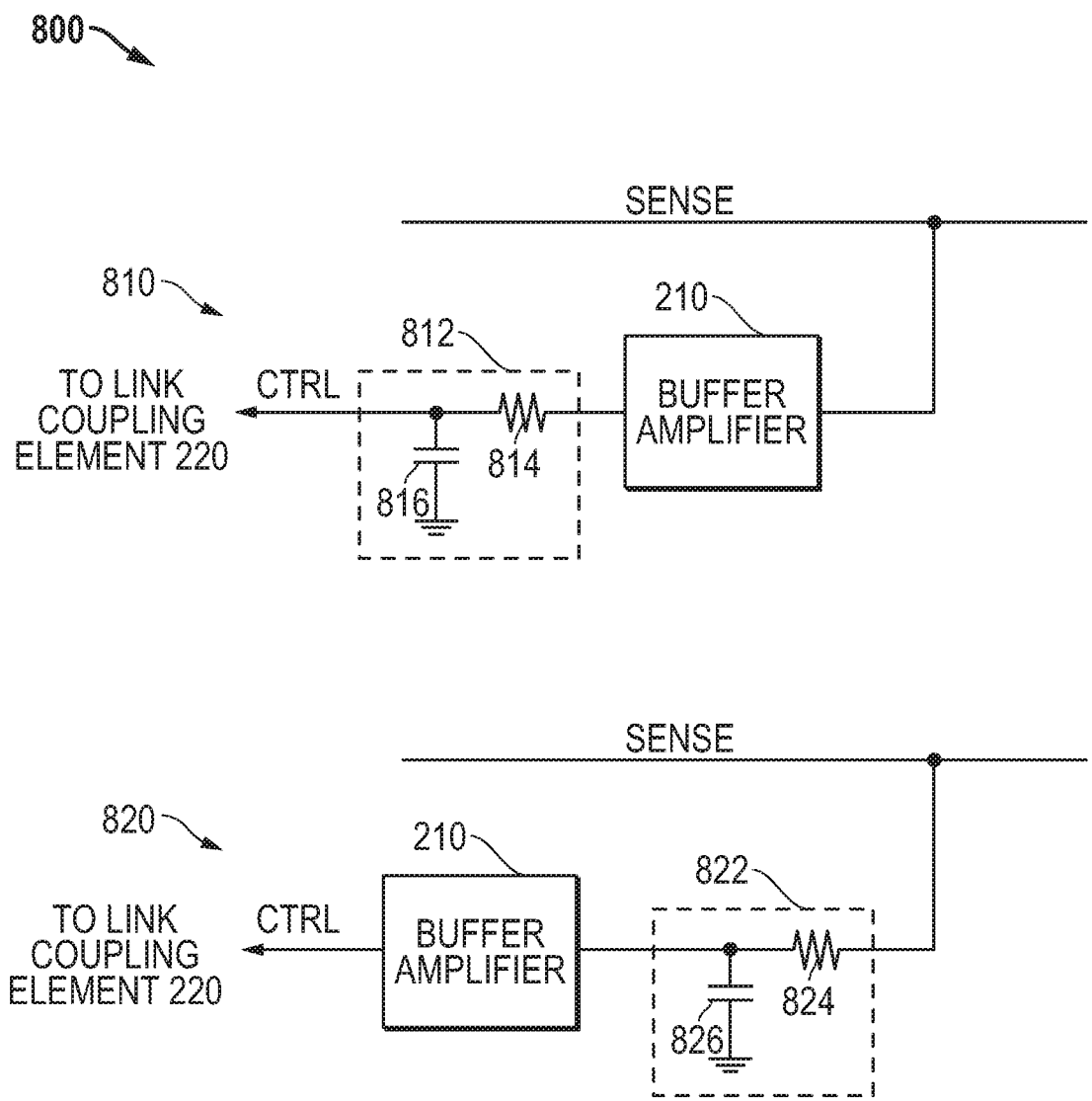
FIG. 8 illustrates in partial block diagram and partial schematic form portions of leakage compensation circuits according to other embodiments.

FIG. 8 illustrates in partial block diagram and partial schematic form portions 800 of leakage compensation circuits 810 and 820 according to other embodiments. Leakage compensation circuit 810 includes buffer amplifier 210 as previously illustrated with respect to FIG. 2 and a lowpass filter 812, along with additional elements of leakage compensation circuit 200 not shown in FIG. 8. Lowpass filter 812 includes a resistor 814 and a capacitor 816. Resistor 814 has a first terminal connected to the output of buffer amplifier 210, and a second terminal connected to the CTRL node. Capacitor 816 has a first terminal connected to the second terminal of resistor 814, and a second terminal connected to ground.

Leakage compensation circuit 820 includes buffer amplifier 210 as previously illustrated with respect to FIG. 2 and a lowpass filter 822, along with additional elements of leakage compensation circuit 200 not shown in FIG. 8. Lowpass filter 822 includes a resistor 824 and a capacitor 826. Resistor 824 has a first terminal connected to the SENSE node, and a second terminal connected to the input of buffer amplifier 210. Capacitor 826 has a first terminal connected to the second terminal of resistor 824, and a second terminal connected to ground.

Leakage compensation circuit 200 is a feedback control loop formed by buffer amplifier 210 having an input connected to the SENSE node, link coupling element 220, and leakage compensation element 230 having an output connected to the SENSE node. In various embodiments, the SENSE node may be carrying a useful signal, or it may receive electromagnetic interference (EMI) noise. Leakage compensation circuits 810 and 820 compensate for signal changes by providing low-pass filtering to prevent the leakage compensation loop from following these signals. It is believed that the simple RC lowpass filters shown in FIG. 8 are sufficient for this purpose. In appropriate circumstances, however, other suitable filters can be used, such as higher-order lowpass filters, bandpass filters, and the like.

Figure 9:
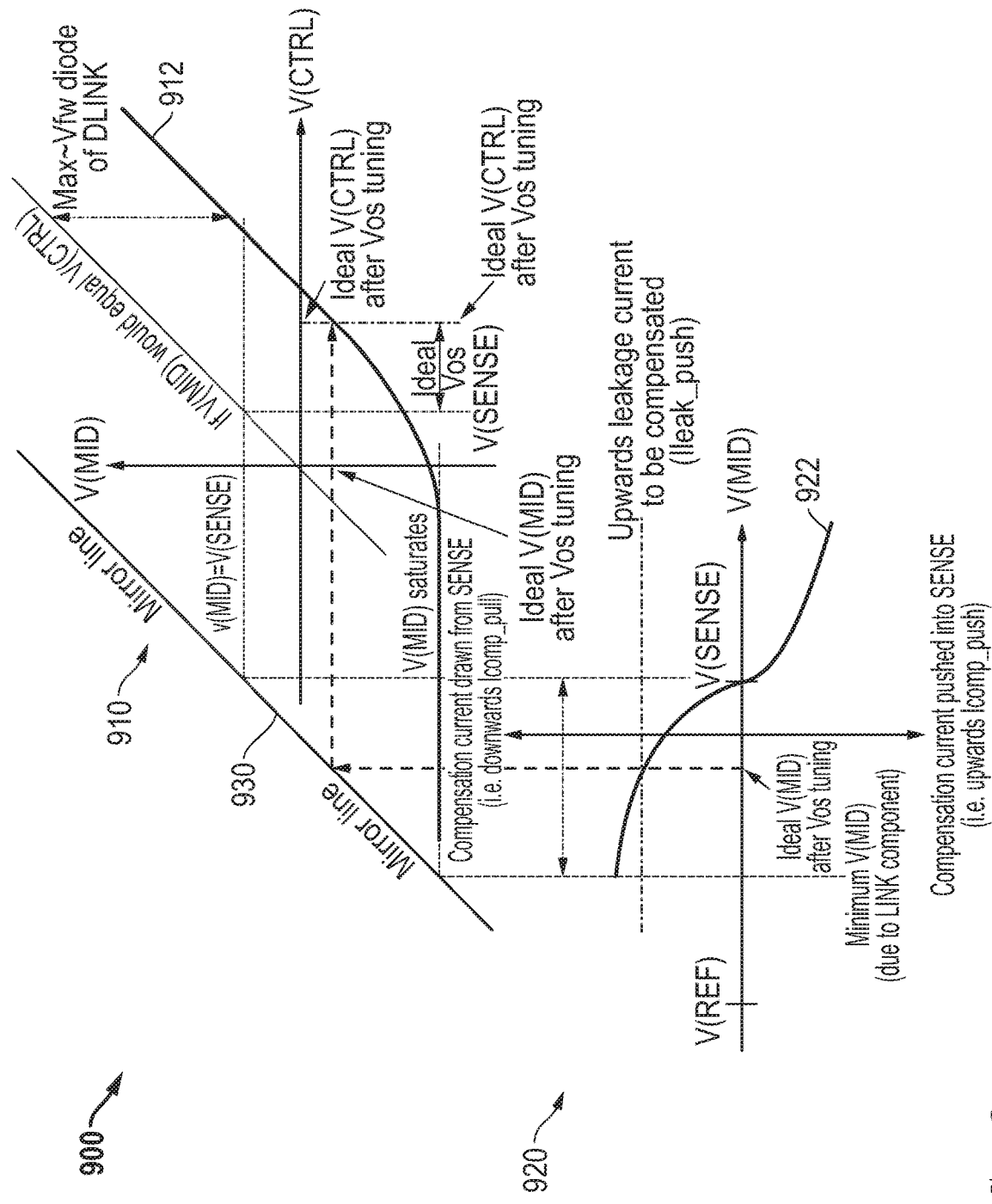
FIG. 9 illustrates a set of related graphs showing the relationship of signals related to the operation of the leakage compensation circuit of FIG. 2.

FIG. 9 illustrates a set of related graphs 900 showing the relationship of signals related to the operation of leakage compensation circuit 200 circuit of FIG. 2. Graphs 900 include a graph 910 and a graph 920 related by a mirror line 930. Graph 910 illustrates the relationship between the voltage of the CTRL node labeled "V(CTRL)" on the horizontal axis in volts, and the voltage of the MID node labeled "V(MID)" on the vertical axis in volts. A waveform 912 shows values of V(MID) as a function of V(CTRL). In general, waveform 912 shows that V(MID) follows V(CTRL) and runs mostly parallel to but shifted downward due to the cut-in voltage of a silicon PN junction diode. For forward biased conditions, it also generally follows a 45-degree line that runs through the origin, as would be expected from a piece-wise linear model of the voltage-current characteristic of a PN junction diode. V(CTRL) is chosen to vary substantially linearly for all voltages of V(MID) above 0 volts to provide a large tuning range. Below V(MID)≈0 volts, V(MID) saturates.

Graph 920 illustrates the relationship between V(MID) along the horizontal axis in volts, and the compensation current $I_{COMP}$ pushed into or pulled from the SENSE node along the vertical axis in picoamperes (pA). Mirror line 930 shows the correspondence of V(MID) along the vertical axis in graph 910 to V(MID) along the horizontal axis in graph 920. A waveform 922 shows $I_{COMP}$ as a function of V(MID).

In the example shown in FIG. 9, a particular leakage current to be compensated is pushed into the SENSE node ($I_{LEAK}$_PUSH), shown along the vertical axis in graph 920. Waveform 922 shows the relationship between V(MID) and the $I_{COMP}$ that would balance ILEAK_PUSH. The intersection of ILEAK_PUSH and waveform 922 indicates the ideal value of V(MID) that would generate an $I_{COMP}$ that is equal and opposite to ILEAK_PUSH. This value of V(MID) is then projected onto waveform 912 using mirror line 930. The value of V(CTRL) at the point that the projected V(MID) line intersects waveform 912 determines the ideal value of V(CTRL). The difference between the ideal V(CTRL) and V(SENSE) is equal to the ideal offset voltage $V_{OS}$.

When V(CTRL)>>V(SENSE), such as when V(SENSE)+$V_{OS}$>>V(SENSE), link coupling element 220 will pull up the MID node to (V(SENSE)+$V_{OS}$−VFW_LINK), in which VFW_LINK is the forward voltage of PN junction diode 222, reversing the potential across PN junction diode 232. In this case, the SENSE node would receive a compensation current $I_{COMP}$ equal to the reverse saturation current of PN junction diode 232. For this example, additional current would be pushed into the SENSE node, tending to pull up the SENSE node. The leakage current of PN junction diode 234 does not flow to the SENSE node, but through PN junction diode 222 and delivered by differential amplifier 212.

When V(CTRL)<<V(SENSE), such as when V(SENSE)+$V_{OS}$<<V(SENSE), the unidirectional property of the PN junction diode 222 may prevent PN junction diode 222 from determining V(MID). Instead, V(MID) will settle to its minimum value, equal to V(SENSE-VFW_DTOP), in which VFW_DTOP is the forward bias cut-in voltage of PN junction diode 232. This condition may occur regardless of how low V(CTRL) is with respect to V(SENSE). In this case, the SENSE node would receive a compensation current $I_{COMP}$ equal to the reverse saturation current of PN junction diode 234 with a reverse voltage equal to V(MID)-REF, and the reverse saturation current of PN junction diode 222 with a reverse voltage equal to V(MID)-V(CTRL). So in this case, $I_{COMP}$ is pulled out of the SENSE node, tending to pull down the SENSE node.

Therefore, by adjusting the voltage on the CTRL node relative to the SENSE node by setting $V_{OS}$, leakage compensation circuit 200 operates bidirectionally and is able to compensate for small leakage currents, regardless of their sign.

Implementations of Leakage Compensation Element 230

As shown in FIG. 2, leakage compensation element 230 is implemented as an anti-series diode. In the example shown in FIG. 2, the anti-series diode can be implemented with two PN junction diodes having a common cathode forming the MID node. In an alternate embodiment, the anti-series diode can be implemented with two PN junction diodes having a common anode forming the MID node. These structures can be implemented in monolithic silicon integrated circuits using a variety of device structures.

Figure 10:
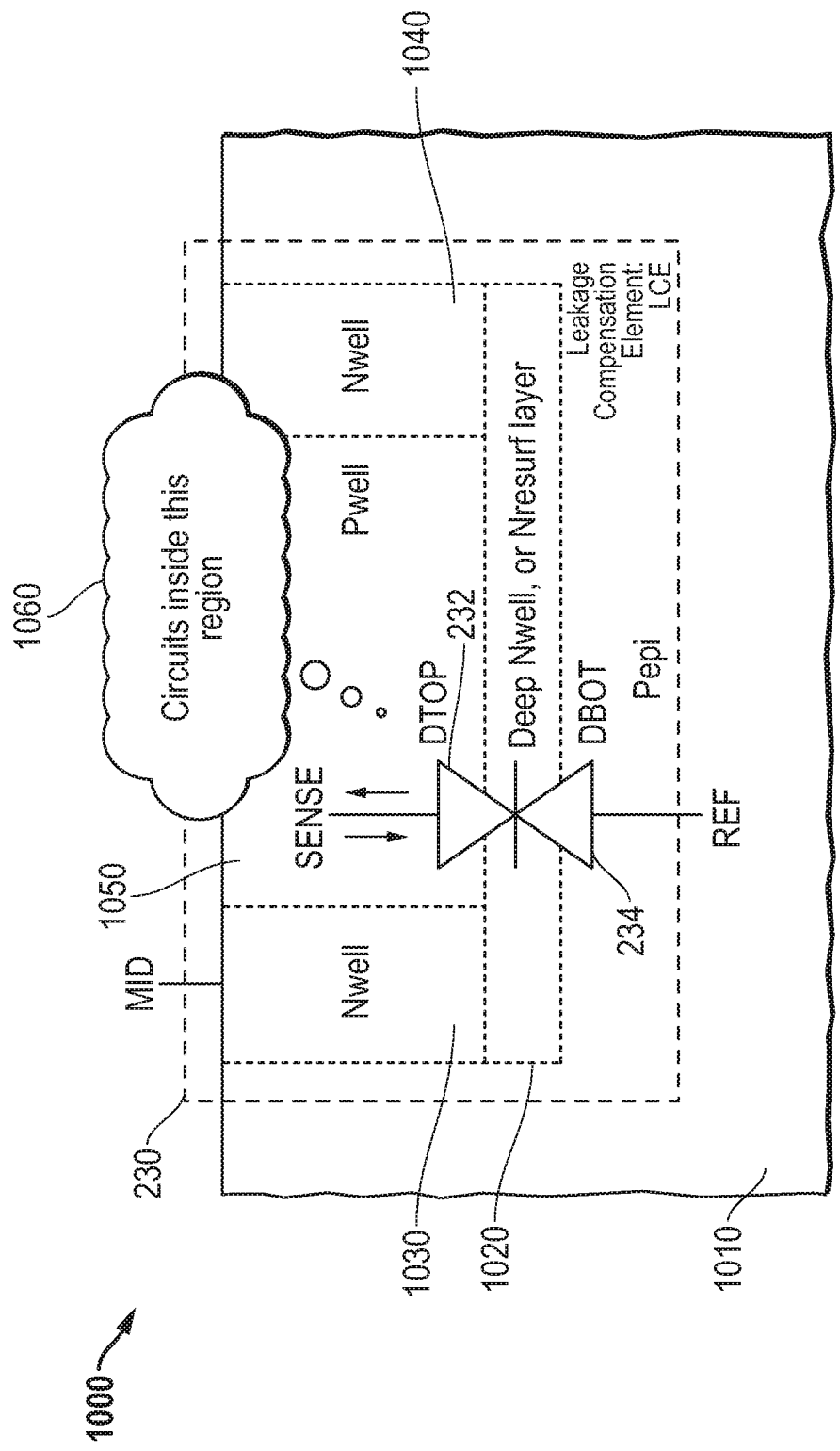
FIG. 10 illustrates a cross section of an integrated circuit that can be used to implement a portion of the leakage compensation circuit of FIG. 2.

FIG. 10 illustrates a cross section of an integrated circuit 1000 that can be used to implement a portion of the leakage compensation element 230 of FIG. 2. The portion of integrated circuit 1000 shows a device structure that can be used to implement leakage compensation element 230. Integrated circuit 1000 includes a semiconductor body 1010 having an epitaxially grown P-type region labeled "Pepi" that forms the anode of the bottom diode (PN junction diode 234). An N-type region 1020 overlies the Pepi region and forms the common cathode region of the anti-series diode. In various embodiments, N-type region 1020 could be a deep N-well region or an N-type resurf region (NRESURF). Integrated circuit 1000 includes N-type semiconductor well regions 1030 and 1040 that extend from N-type region 1020 to the surface of semiconductor substrate 1110. Both N-type well region 1030 and N-type well region 1040 isolate a P-type well region 1050 from surrounding circuits. P-type well region 1050 forms the anode of PN junction diode 232 of the leakage compensation element and also forms the SENSE node. Inside P-type well region 1050 may be other circuits 1060 that may form all or part of sensor 110, a part of buffer amplifier 210, or other elements and circuits of integrated circuit 1000.

Figure 11:
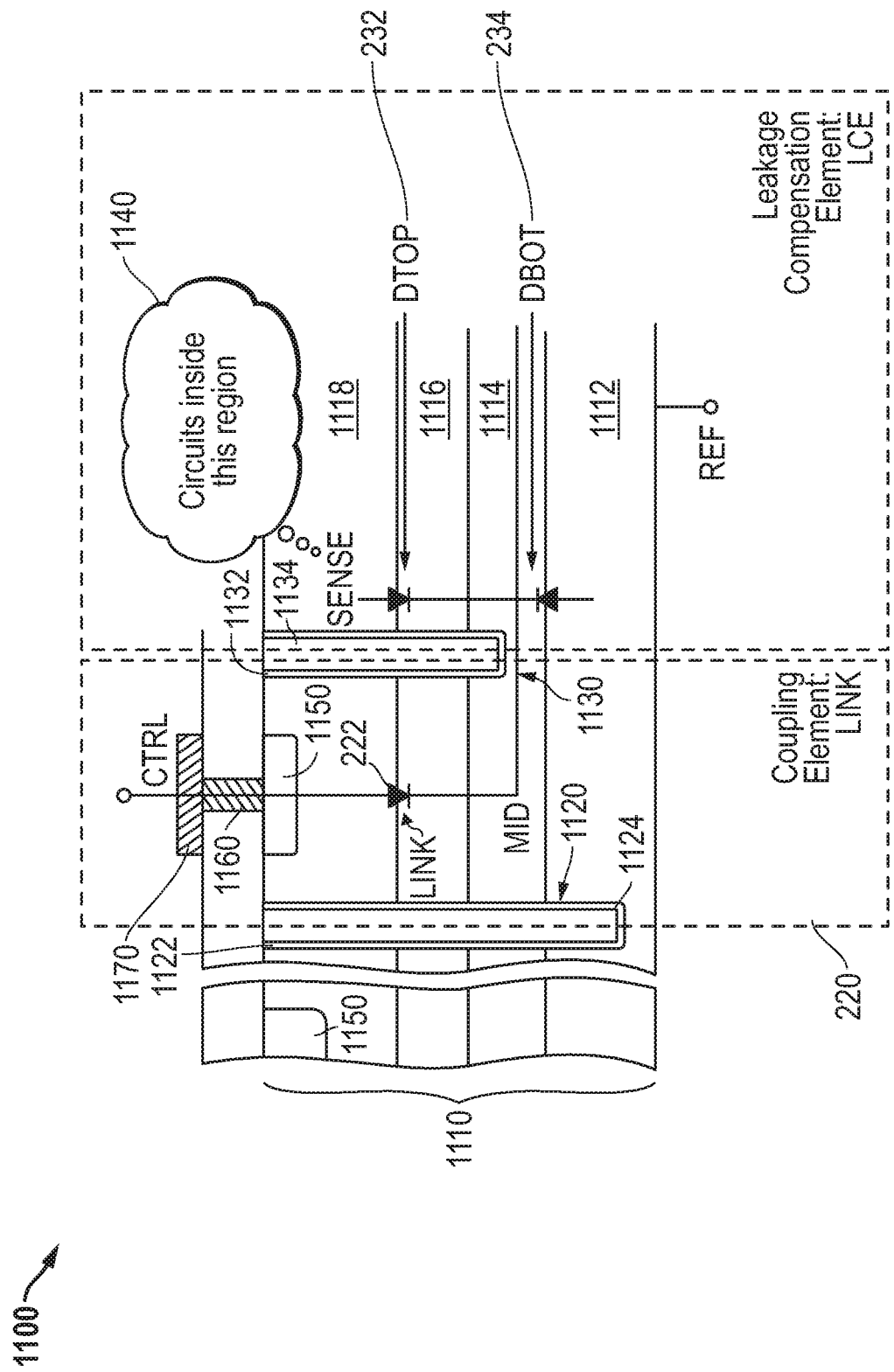
FIG. 11 illustrates a cross section of another integrated circuit that can be used to implement a portion of the leakage compensation circuit of FIG. 2.

FIG. 11 illustrates a cross section of another integrated circuit 1100 that can be used to implement a portion of leakage compensation circuit 200 of FIG. 2 according to various embodiments. The inventors of the present application have leveraged this structure, known as a medium trench isolation (MTI) structure, to implement leakage compensation circuit 200. Details of the structure of integrated circuit 1100 are described in U.S. Pat. No. 10,026,728, which is incorporated herein by reference in its entirety.

Integrated circuit 1100 includes a semiconductor substrate 1110 in which link coupling element 220 and leakage compensation element 230 are formed. Semiconductor substrate 1110 includes a P-type region 1112, a buried N-type region 1114, an N-type region 1116, a P-type region 1118, a deep trench structure 1120, a medium trench isolation (MTI) structure 1130, a circuit region 1140, circuit regions 1150, a conductive contact 1160, and an electrode 1170. P-type region 1112 serves as the REF node and with buried N-type region 1114 forms the bottom diode (PN junction diode 234). N-type region 1116 and overlying P-type region 1118 together form the top diode (PN junction diode 232), with P-type region 1118 forming the SENSE node. The portion of N-type region 1116 and P-type region 1118 between deep trench structure 1120 and MTI structure 1130 form PN junction diode 222. Deep trench structure 1120 includes a dielectric layer 1122 lining the deep trench structure, and a polycrystalline silicon layer 1124 filling deep trench structure 1120. Likewise, MTI structure 1130 includes a dielectric layer 1132 lining MTI structure, and a polycrystalline silicon layer 1134 filling MTI structure 1130.

Since N-type region 1114 is not interrupted by MTI structure 1130, the cathode of PN junction diode 222 is electrically connected to the cathodes of PN junction diodes 232 and 234 conveniently forms the MID node. Thus, the device structure shown in the cross-section of FIG. 11 with MTI structure 1130 can be used to form link coupling element 220 and leakage compensation element 230.

The device structures shown in FIG. 11 can be implemented using known integrated circuit fabrication techniques, including those described in U.S. Pat. No. 10,026,728 as well as other known techniques. In the embodiment shown in FIG. 11, the device structures use a bulk process but in other embodiments, they can be formed with corresponding epitaxial structures.

Figure 12:
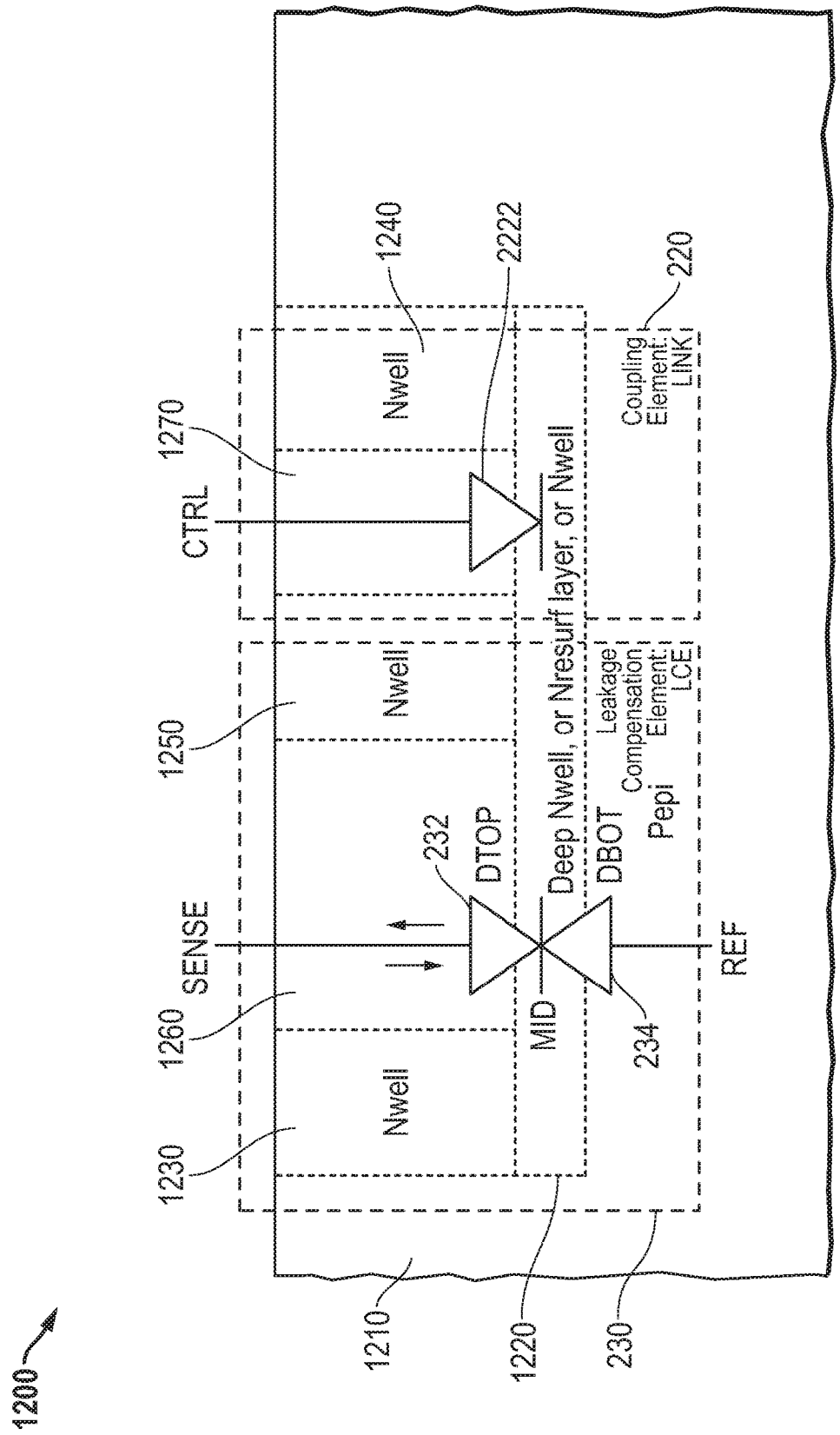
FIG. 12 illustrates a cross section of yet another integrated circuit that can be used to implement a portion of the leakage compensation circuit of FIG. 2.

FIG. 12 illustrates a cross section of yet another integrated circuit 1200 that can be used to implement a portion of leakage compensation circuit 200 of FIG. 2. The portion of integrated circuit 1200 shown in FIG. 12 implements link coupling element 220 and leakage compensation element 230. Integrated circuit 1200 includes a semiconductor body 1210 having a Pepi region that forms the anode of the bottom diode (PN junction diode 234). An N-type region 1220 overlies the Pepi region and forms the common cathode region of the anti-series diode as well as the cathode region of PN junction diode 222 in link coupling element 220. In various embodiments, N-type region 1020 could be a deep N-well region, an N-type resurface region (NRESURF), or an N-type well region. Integrated circuit 1200 includes N-type semiconductor well regions 1230, 1240, and 1250 forming the MID node that extends from deep N-well region 1220 to the surface of semiconductor body 1210. N-type well region 1230 and N-type well region 1250 isolate a P-type well region 1260 from surrounding circuits. P-well region 1260 forms the anode of PN junction diode 232 of leakage compensation element 230 and also forms the SENSE node. N-type well region 1250 and N-type well region 1240 isolate a P-type well region 1270 from surrounding circuits. P-type well region 1270 forms the anode of PN junction diode 222 of link coupling element 220 and also forms the CTRL node.

Figure 13:
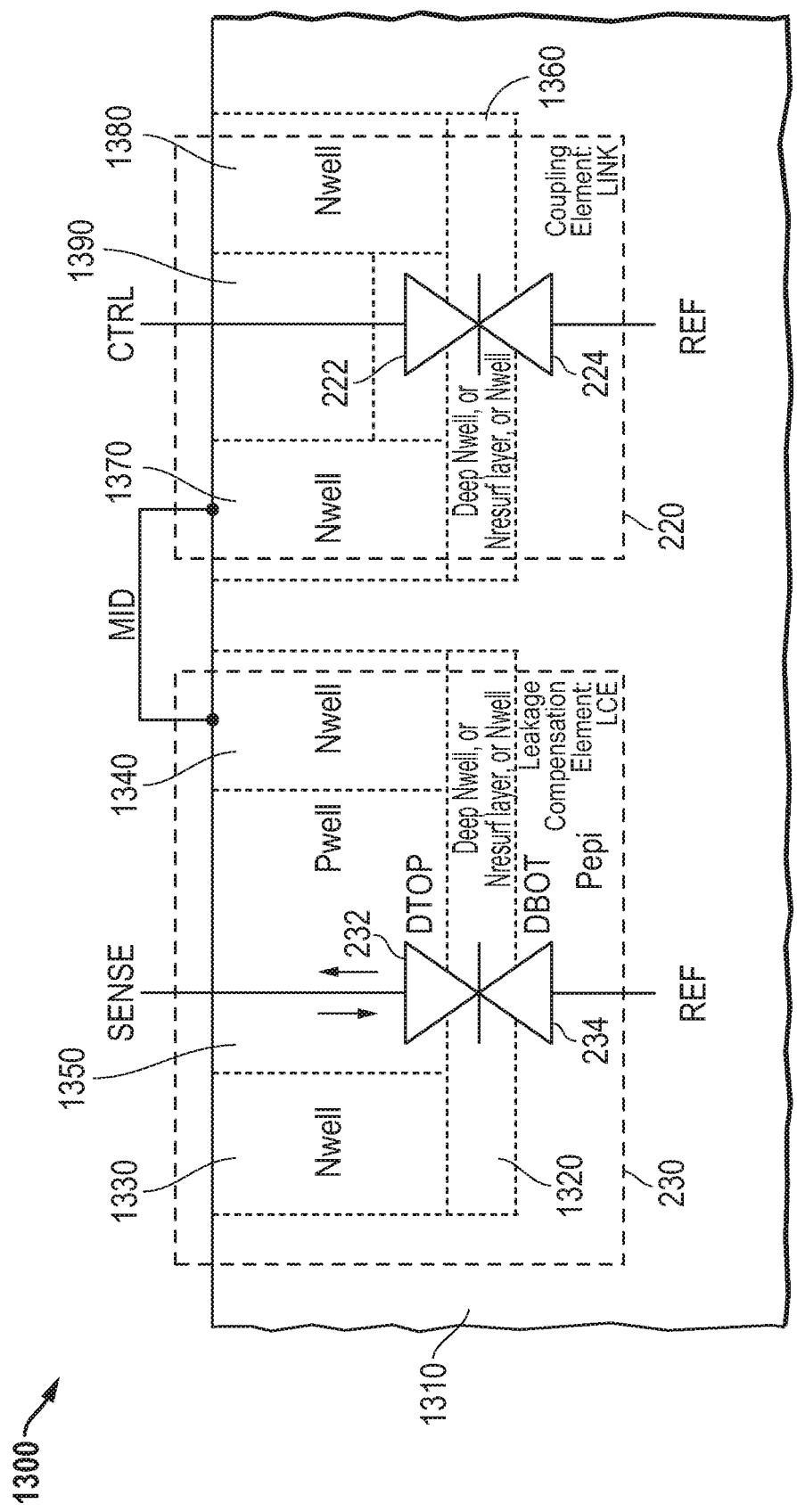
FIG. 13 illustrates a cross section of still another integrated circuit that can be used to implement a portion of the leakage compensation circuit of FIG. 2.

FIG. 13 illustrates a cross section of still another integrated circuit 1300 that can be used to implement a portion of leakage compensation circuit 200 of FIG. 2. Integrated circuit 1300 includes a semiconductor body 1310 having a Pepi region that forms the anode of the bottom diode (PN junction diode 234). A first N-type region 1320 overlies the Pepi region and forms the common cathode region of the anti-series diode. Integrated circuit 1300 includes N-type semiconductor well regions 1330 and 1340 forming the MID node that extends from first N-type region 1320 to the surface of semiconductor body 1310. N-well regions 1330 and 1340 surround and isolate a P-type well region 1350. P-type well region 1350 forms the anode of PN junction diode 232 of leakage compensation element 230 and also forms the SENSE node. A second N-type region 1360 overlies the Pepi region and forms the common cathode region of a second anti-series diode. Integrated circuit 1300 includes N-type well regions 1370 and 1380 forming the MID node that extends from second N-type region 1360 to the surface of semiconductor body 1310. N-type well regions 1370 and 1380 surround and isolate a P-well region 1390. P-type well region 1390 forms the anode of PN junction diode 222 of link coupling element 220 and also forms the CTRL node. In various embodiments, N-regions 1320 and 1360 could be deep N-well regions, NRESURF regions, or N-type well regions. The portion of integrated circuit 1300 shows a device structure that can be used to implement link coupling element 220 and leakage compensation element 230 using only one type of device structure, in which case a PN junction diode 224 exists but is not used.

Figure 14:
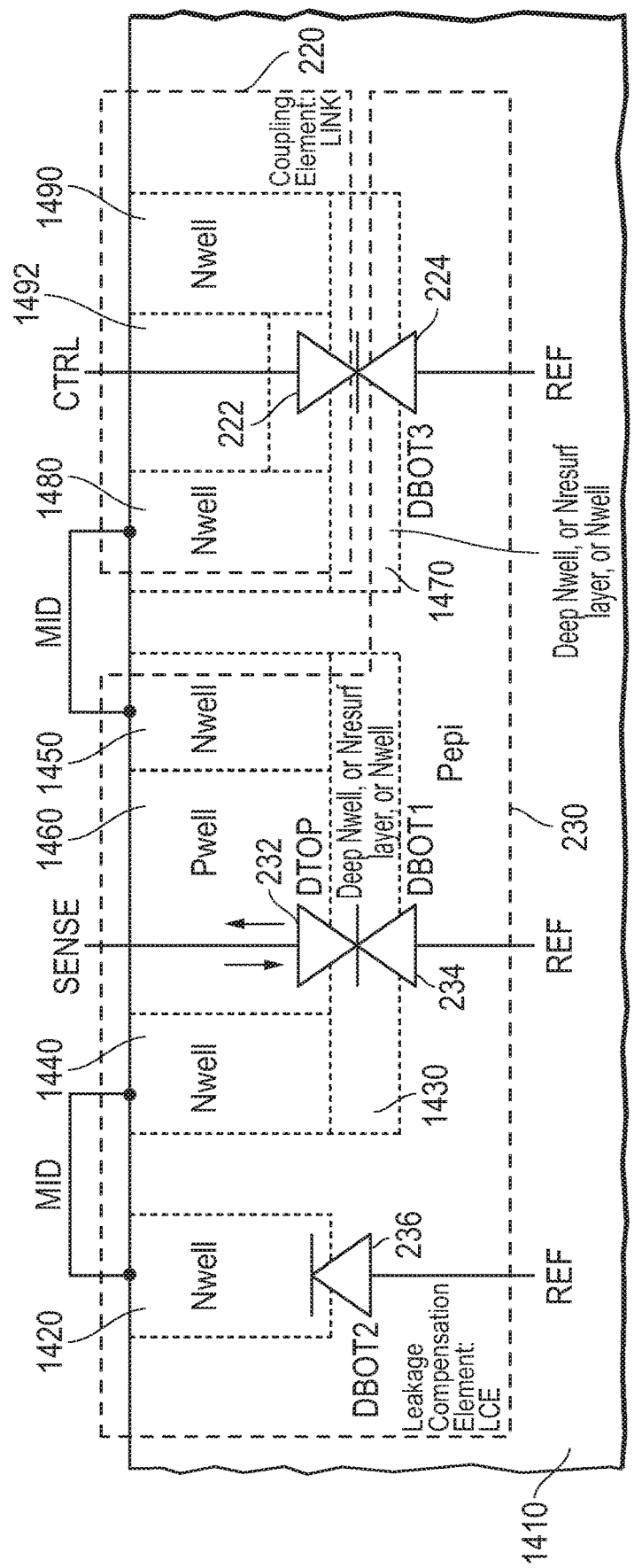
FIG. 14 illustrates a cross section of yet another integrated circuit that can be used to implement a portion of the leakage compensation circuit of FIG. 2.

FIG. 14 illustrates a cross section of yet another integrated circuit 1400 that can be used to implement a portion of leakage compensation circuit 200 of FIG. 2. Integrated circuit 1400 includes a semiconductor body 1410 having a Pepi region that forms the anode of the bottom diode, PN junction diode 234. A first N-type region 1430 overlies the Pepi region and forms the common cathode region of the anti-series diode. Integrated circuit 1400 includes N-type well regions 1440 and 1450 forming the MID node that extends from first N-type region 1430 to the surface of semiconductor body 1410. N-type well regions 1430 and 1450 surround and isolate a P-type well region 1460. P-type well region 1460 forms the anode of PN junction diode 232 of leakage compensation element 230 and also forms the SENSE node. A second N-type region 1470 overlies the Pepi region and forms the common cathode region of a second anti-series diode. Integrated circuit 1300 includes N-type well regions 1480 and 1490 also forming the MID node that extend from second N-type region 1470 to the surface of semiconductor body 1310 and are connected to N-type well region 1450 by a metal conductor. N-type well regions 1480 and 1490 surround and isolate a P-type well region 1492. P-type well region 1492 forms the anode of PN junction diode 222 of link coupling element 220 and also forms the CTRL node. The portion of integrated circuit 1400 shows a device structure that can be used to implement link coupling element 220 and leakage compensation element 230 using only one type of device structure, in which case PN junction diode 224 exists but is not used.

In addition, integrated circuit 1400 includes an N-type well region 1420 that forms a cathode of a PN junction diode 236. The anode of PN junction diode 236 is formed in semiconductor body 1410. N-type well 1420 is connected to the MID node, for example at N-type well region 1440, through a metal connection. Diode 236 operates in parallel with diode 234 to increase the reverse saturation current. The portion of integrated circuit 1400 shown in FIG. 14 implements a modification of the link coupling element 230 that has increased junction area of the bottom diode to allow increased reverse saturation current when the MID node is biased to a relatively high voltage.

Thus, a leakage compensation circuit and method as disclosed herein accurately compensates for small leakage currents that are not easily compensated by conventional techniques. The leakage compensation circuit exhibits temperature dependence that will track the temperature dependence of various leakage sources such as ESD protection diodes. In one form, a leakage compensation circuit includes a buffer amplifier, a link coupling element, and a leakage compensation element. The buffer amplifier has an input connected to a sense node, and an output. The link coupling element has an input connected to the output of the buffer amplifier, and an output, wherein the link coupling element is unidirectional in a direction from the input to the output thereof. The leakage compensation element has a first current terminal connected to the sense node, a control terminal connected to the output of the link coupling element, and a second current terminal connected to a reference voltage terminal.

The leakage compensation circuit includes a leakage compensation element that is capable of injecting a compensation current $I_{COMP}$ with a variable magnitude and a variable sign. It acts as a voltage-controlled bidirectional current source and makes in-situ leakage compensation possible. A sensor circuit incorporating the leakage compensation circuit can thus achieve a higher dynamic input range.

The above-disclosed subject matter is to be considered illustrative, and not restrictive, and the appended claims are intended to cover all such modifications, enhancements, and other embodiments that fall within the true scope of the claims. For example, various embodiments of each of the buffer amplifier, the link coupling element, and the leakage compensation element are possible. For example, the buffer amplifier can generate a desired offset for the SENSE node in a variety of ways. The link coupling element may be implemented with a unidirectional circuit element such as a diode, MOS transistor source follower, or a bipolar transistor emitter follower. The leakage compensation element can also be implemented in a variety of ways. If an anti-series diode is used for the link coupling element, the anti-series diode can be formed with either back-to-back cathodes or back-to-back anodes. The anti-series diode can also be implemented with various integrated circuit device structures, including one in which the link coupling element and the leakage compensation element share a common buried diffusion region using MTI structures.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A leakage compensation circuit comprising:
   a buffer amplifier having an input coupled to a sense node, and an output;
   a link coupling element having an input coupled to said output of said buffer amplifier, and an output, wherein said link coupling element is unidirectional in a direction from said input to said output thereof; and
   a leakage compensation element having a first current terminal coupled to said sense node, a control terminal coupled to said output of said link coupling element, and a second current terminal coupled to a reference voltage terminal, wherein said leakage compensation element comprises an anti-series diode.

2. The leakage compensation circuit of claim 1, wherein said buffer amplifier comprises:

a differential amplifier having a positive input coupled to said sense node, a negative input, and an output coupled to said negative input forming said output of said buffer amplifier.

3. The leakage compensation circuit of claim 2, wherein said buffer amplifier further comprises:
   a variable-offset generator coupled between said sense node and one of said positive input of said differential amplifier and said negative input of said differential amplifier, and having a control input for receiving a digital trim signal; and
   an offset circuit having an output coupled to said control input of said variable-offset generator for providing said digital trim signal.

4. The leakage compensation circuit of claim 1, wherein said buffer amplifier comprises:
   a single-ended non-inverting amplifier having a positive input coupled to said sense node, and an output coupled to said output of said buffer amplifier.

5. The leakage compensation circuit of claim 4, wherein said buffer amplifier further comprises:
   a variable-offset generator coupled between one of: said sense node and said output of said buffer amplifier, and said output of said buffer amplifier and said input of said link coupling element, and having a control input for receiving a digital trim signal; and
   an offset circuit having an output coupled to said control input of said variable-offset generator for providing said digital trim signal.

6. The leakage compensation circuit of claim 1, wherein said link coupling element comprises:
   a diode having an anode coupled to said output of said buffer amplifier, and a cathode coupled to said control terminal of said leakage compensation element.

7. The leakage compensation circuit of claim 1, wherein said link coupling element comprises:
   a metal-oxide-semiconductor (MOS) transistor having a drain coupled to a second reference voltage terminal, a gate coupled to said output of said buffer amplifier, and a source coupled to said control terminal of said leakage compensation element.

8. The leakage compensation circuit of claim 1, wherein said link coupling element comprises:
   a bipolar transistor having a collector coupled to a second reference voltage terminal, a base coupled to said output of said buffer amplifier, and an emitter coupled to said control terminal of said leakage compensation element.

9. The leakage compensation circuit of claim 1, wherein said
   anti-series diode has a first current terminal coupled to said sense node, a second current terminal coupled to said reference voltage terminal, and a middle terminal functioning as said control terminal of said leakage compensation element coupled to said output of said link coupling element.

10. The leakage compensation circuit of claim 9, wherein said anti-series diode comprises:
    a first PN diode having an anode coupled to said sense node, and a cathode forming said middle terminal of said anti-series diode; and
    a second PN diode having an anode coupled to reference voltage terminal, and a cathode coupled to said cathode of said first PN diode.

11. The leakage compensation circuit of claim 1, further comprising:

a filter for compensating a loop between said sense node and said first current terminal of said leakage compensation element.

12. An integrated circuit having a leakage compensation circuit, the leakage compensation circuit comprising:
    a buffer amplifier having an input coupled to a sense node, and an output;
    a link coupling element having an input coupled to said output of said buffer amplifier, and an output, wherein said link coupling element is unidirectional in a direction from said input to said output thereof; and
    a leakage compensation element having a first current terminal coupled to said sense node, a control terminal coupled to said output of said link coupling element, and a second current terminal coupled to a reference voltage terminal, wherein said leakage compensation element comprises an anti-series diode.

13. The leakage compensation circuit of claim 12, wherein:
    said first current terminal of said leakage compensation element is formed in a first region of the integrated circuit, and said first region comprises at least one semiconductor device formed in said first region.

14. The integrated circuit of claim 12, wherein said anti-series diode has a first current terminal coupled to said sense node, a second current terminal coupled to said reference voltage terminal, and a middle terminal forming said control terminal of said leakage compensation element coupled to said output of said link coupling element.

15. The integrated circuit of claim 14, wherein:
    said middle terminal of said anti-series diode and said output of said link coupling element are formed in a common semiconductor region.

16. The integrated circuit of claim 15, wherein:
    said common semiconductor region is a common floating buried layer, and said input of said link coupling element is isolated from said first current terminal of said anti-series diode by a trench (1124A) that partially penetrates the common semiconductor region (1114).

17. The integrated circuit of claim 14, wherein said anti-series diode (230) comprises:
    a first PN diode (232) having an anode coupled to said sense node, and a cathode forming said middle terminal of said anti-series diode (230); and
    a second PN diode (234) having an anode coupled to said reference voltage terminal, and a cathode coupled to said cathode of said first PN diode (232).

18. The integrated circuit of claim 17, further comprising:
    a semiconductor region of a first conductivity type,
    wherein said semiconductor region forms a terminal region of both said first PN diode and said second PN diode.

19. The integrated circuit of claim 14, further comprising:
    a semiconductor region of a first conductivity type,
    wherein said semiconductor region forms a terminal region of said anti-series diode and terminals of other semiconductor devices.

20. The integrated circuit of claim 12, wherein:
    said output of said link coupling element and said control terminal of said leakage compensation element are coupled together using a metal connection.

21. A method of performing leakage compensation for leakage currents flowing to or from a sense node, comprising:

buffering a voltage on the sense node and providing a buffered voltage to a middle node in response to said buffering;

unidirectionally coupling said buffered voltage to a control node; and biasing a leakage compensation element having a first current terminal coupled to said sense node and a second current terminal coupled to a reference voltage terminal by coupling a control terminal of said leakage compensation element to said control node, wherein said biasing said leakage compensation element comprises biasing an anti-series diode.

22. The method of claim 21, wherein said buffering comprises:

buffering said voltage on the sense node using a differential amplifier; and applying an offset to said differential amplifier.

23. The method of claim 21, wherein said unidirectionally coupling said buffered voltage to said control node comprises:

coupling said buffered voltage to said control node using a PN diode.

24. The method of claim 21, wherein said unidirectionally coupling said buffered voltage to said control node comprises:

coupling said buffered voltage to said control node using a metal-oxide-semiconductor (MOS) transistor having a drain coupled to a second reference voltage terminal, a gate for receiving said buffered voltage, and a source coupled to said middle node.

25. The method of claim 21, wherein said unidirectionally coupling said buffered voltage to said control node comprises:

coupling a bipolar transistor having a collector coupled to a second reference voltage terminal, a base for receiving said buffered voltage, and an emitter coupled to said control node.

26. The method of claim 21, wherein said biasing said anti-series diode comprises:

coupling a first current terminal thereof to said sense node, a second current terminal thereof to said reference voltage terminal, and a middle terminal thereof to said control node.

\* \* \* \* \*